(12) United States Patent
Castillo Buenaventura et al.

(10) Patent No.: US 12,044,734 B2
(45) Date of Patent: Jul. 23, 2024

(54) POSITION RELIABILITY OF MAGNETS OF A SWITCHING DEVICE

(71) Applicant: Schneider Electric Industries SAS, Rueil Malmaison (FR)

(72) Inventors: Felipe Castillo Buenaventura, Angoulême (FR); Caijin Wang, Singapore (SG)

(73) Assignee: Schneider Electric Industries SAS, Rueil Malmaison (FR)

( * ) Notice: Subject to any disclaimer, the term of this patent is extended or adjusted under 35 U.S.C. 154(b) by 110 days.

(21) Appl. No.: 17/847,243

(22) Filed: Jun. 23, 2022

(65) Prior Publication Data

US 2023/0003797 A1    Jan. 5, 2023

(30) Foreign Application Priority Data

Jul. 1, 2021 (EP) .................................... 21305907

(51) Int. Cl.
*G01R 31/327* (2006.01)
*H01H 47/00* (2006.01)
*H01H 50/18* (2006.01)

(52) U.S. Cl.
CPC ......... *G01R 31/327* (2013.01); *H01H 47/002* (2013.01); *H01H 50/18* (2013.01)

(58) Field of Classification Search
CPC .................................................. G01R 31/327
See application file for complete search history.

(56) References Cited

U.S. PATENT DOCUMENTS

| 9,318,280 B2 * | 4/2016 | Bachmann ............. H03K 17/97 |
| 2008/0284549 A1 | 11/2008 | Bedell | |
| 2015/0025761 A1 | 1/2015 | Kernebeck | |
| 2016/0069709 A1 | 3/2016 | Kernebeck | |
| 2016/0172136 A1 * | 6/2016 | McGaffey ............. G08G 1/005 335/179 |
| 2023/0045318 A1 * | 2/2023 | Castillo ................ H01H 50/641 |

FOREIGN PATENT DOCUMENTS

| DE | 102011107640 A1 | 1/2013 |
| GB | 2087079 A | 5/1982 |

OTHER PUBLICATIONS

European Search Report and Search Opinion dated Jan. 4, 2022 for corresponding European Patent Application No. EP21305907.4, 5 pages.

* cited by examiner

*Primary Examiner* — Reena Aurora
(74) *Attorney, Agent, or Firm* — Locke Lord LLP

(57) ABSTRACT

A switching device includes: a housing; a moveable element, including a header and first and second magnets, slidable in the housing, the moveable element moveable between released and engaged positions; and a microcontroller and first and second magnetic sensing elements facing the first and second magnets. The first and second magnetic sensing elements detect respectively first and second magnetic fields generated respectively by the first and second magnets. A pole configuration of the first magnet is opposed to a pole configuration of the second magnet and the first magnetic field is reversed and equal in magnitude to the second magnetic field. The microcontroller is able to validate that first and second output signals produced by the first and second magnetic sensing elements, respectively, from the first and second magnetic fields are reliable for determining a position of the moveable element.

10 Claims, 4 Drawing Sheets

POSITION RELIABILITY OF MAGNETS OF A SWITCHING DEVICE

FIELD OF INVENTION

The present disclosure generally relates to a magnetic based contactless switching device suitable for push buttons and selectors.

BACKGROUND

Switching devices typically refer to any device that makes or breaks an electrical circuit. Electrical switching devices all consist of sets of contacts that open and close when the device is activated. Switching devices are operated in a variety of ways, from the simplest of which are manual switches such as the domestic light switch to more complex switches used in industrial applications. In such cases, switching devices can be operated using an electromagnetic coil as inductor element with magnetic sensing elements to activate the switch.

Examples of such applications include, but are not limited to, commercial aviation, space flight, military applications and industrial processes, where reliability of the state of the switching device is demanded to ensure continued performance of equipment in the event of a partial failure. Such stringent requirements are demanded because of the potential consequences of failure.

There is therefore a need for a switching device having high reliability of the state of the switching device.

SUMMARY

This summary is provided to introduce concepts related to the present inventive subject matter. This summary is not intended to identify essential features of the claimed subject matter nor is it intended for use in determining or limiting the scope of the claimed subject matter.

In one implementation, there is provided a switching device comprising:
 a housing,
 a moveable element made of a header, a first magnet and a second magnet and slidably mounted in the housing, the moveable element being adapted to move relative to the housing between a released position and an engaged position,
 a printed circuit board comprising a microcontroller and an upper face on which are mounted upfront a first magnetic sensing element and a second magnetic sensing element positioned to face the first magnet and the second magnet,
 wherein the first magnetic sensing element and the second magnetic sensing element are configured to detect respectively a first magnetic field and a second magnetic field generated respectively by the first magnet and the second magnet, wherein the moveable element is closer to the first magnetic sensing element and the second magnetic sensing element in the engaged position than in the resting position,
 wherein the pole configuration of the first magnet is opposed to the pole configuration of the second magnet and the first magnetic field generated by the first magnet is reversed in magnitude with respect to the second magnetic field generated by the second magnet,
 wherein the first magnetic sensing element and the second magnetic sensing element are able to produce respectively a first output signal and a second output signal from the first magnetic field and the second magnetic field,
 wherein the microcontroller is able to validate a reliable position of the moveable element:
  if the first output signal is included in a first range of values and if the second output signal is included in a second range of values, and
  if the sum of the first output signal and the second output signal is substantially equal to a predefined value derived from the difference between the magnitude of the first magnetic field and the magnitude of the second magnetic field.

The switching device allows robustifying the sensing of a redundant position against external magnetic perturbations. More precisely, the switching device allows to significantly increase the diagnostic coverage and perturbation rejection by using opposite magnetic poles between the two redundant input channels of switching devices. This architecture enables to perform simple software-based plausibility checks that allow discriminating clearly the magnetic perturbations from actual magnetic measurements.

Advantageously, the arrangement allows a simple and compact verification system that can be fitted in many applications such as push buttons and selectors but also extended to any application that requires highly reliable switching devices.

Due to the opposed pole configuration, there is a consistent and repeatable pattern to determine whether the state of the switching device has been changed or not, which cannot be obtained by an external perturbation. The switching device allows to significantly increase the diagnostic coverage and perturbation immunity in the switching function.

In an embodiment, the microcontroller is able to detect a magnetic perturbation:
 if the first output signal is not included in a first range of values or if the second output signal is not included in a second range of values, and/or
 if the sum of the first output signal and the second output signal is not substantially equal to the predefined value.

In an embodiment, the microcontroller is able to trigger an alert if a magnetic perturbation is detected.

In an embodiment, the predefined value is zero if the first magnet and the second magnet have the same properties.

In an embodiment, when the switching device is operated, the header is pressed towards the printed circuit board, the first magnet and the second magnet get closer respectively to the first magnetic sensing element and the second magnetic sensing element, which increases the magnetic flux through the magnetic sensing elements and changes the status of the switching device if a threshold is reached.

In an embodiment, the first magnetic sensing element and the second magnetic sensing element are omni-polar sensors being able to differentiate a north magnetic pole from a south magnetic pole.

In an embodiment, the first magnetic sensing element is aligned with the first magnet and the first inductor and the second magnetic sensing element is aligned with the second magnet and the second inductor.

In another implementation, there is provided a method for validating a reliable position of a moveable element of a switching device comprising a housing, the moveable element being made of a header, a first magnet and a second magnet and slidably mounted in the housing, the moveable element being adapted to move relative to the housing between a released position and an engaged position, the switching device further comprising a printed circuit board comprising a microcontroller and an upper face on which are mounted upfront a first magnetic sensing element and a second magnetic sensing element positioned to face the first magnet and the second magnet, the method comprising:

the first magnetic sensing element and the second magnetic sensing element detecting respectively a first magnetic field and a second magnetic field generated respectively by the first magnet and the second magnet, wherein the moveable element is closer to the first magnetic sensing element and the second magnetic sensing element in the engaged position than in the resting position, wherein the pole configuration of the first magnet is opposed to the pole configuration of the second magnet and the first magnetic field generated by the first magnet is reversed and equal in magnitude with respect to the second magnetic field generated by the second magnet, the first magnetic sensing element and the second magnetic sensing element producing respectively a first output signal and a second output signal from the first magnetic field and the second magnetic field, the microcontroller validating a reliable position of the moveable element:

if the first output signal is included in a first range of values and if the second output signal is included in a second range of values, and if the sum of the first output signal and the second output signal is substantially equal to a predefined value derived from the difference between the magnitude of the first magnetic field and the magnitude of the second magnetic field.

In another implementation there is provided a computer-readable medium having embodied thereon a computer program for validating a reliable position of a moveable element of a switching device. Said computer program comprises instructions which carry out steps according to the method according to the invention.

BRIEF DESCRIPTION OF THE FIGURES

The detailed description is described with reference to the accompanying figures. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

The same reference number represents the same element or the same type of element on all drawings.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

DESCRIPTION OF EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
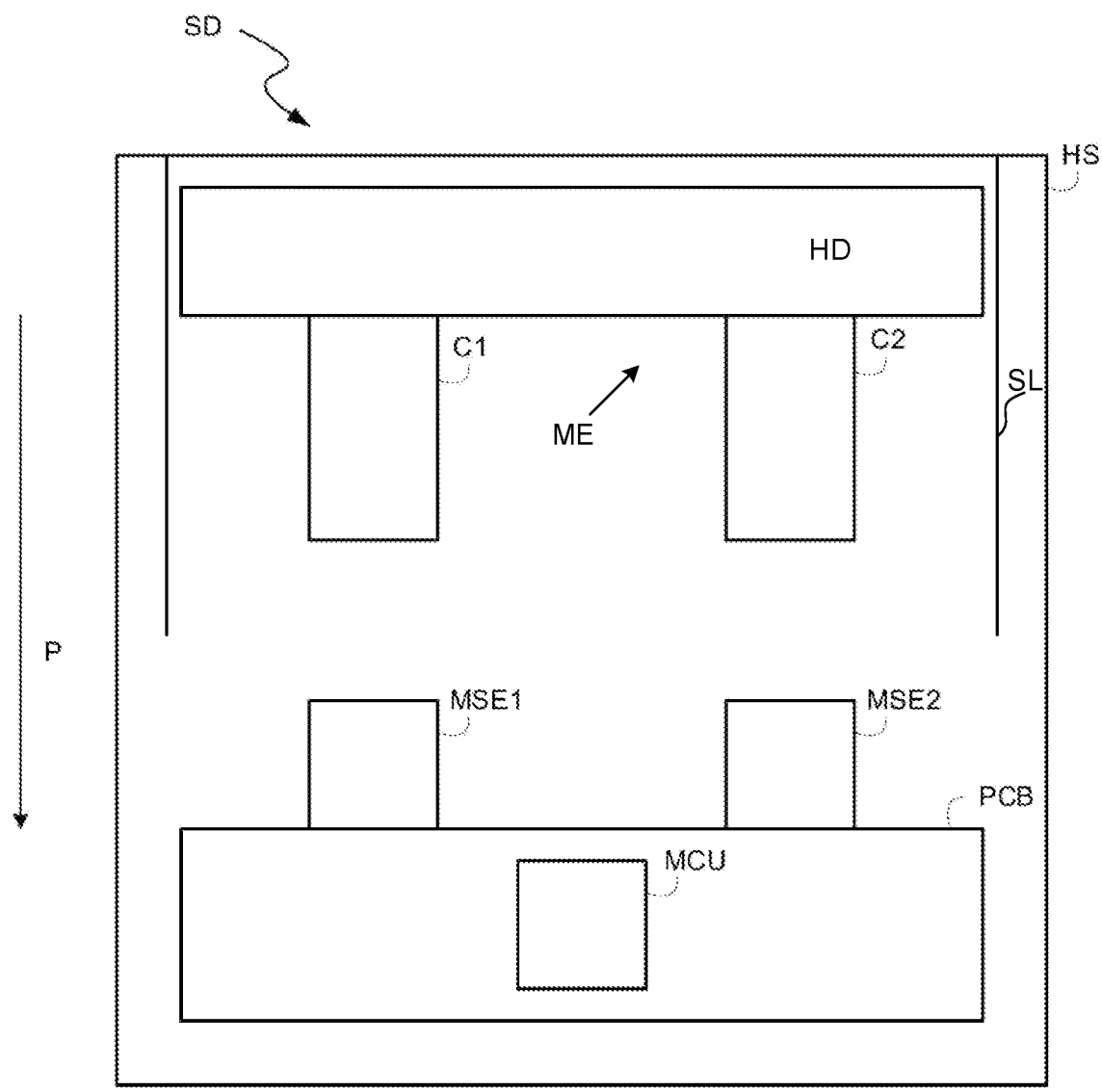
FIG. 1 shows a schematic block diagram of a switching device according to one embodiment.

Referring to FIG. 1, a switching device SD comprises a housing HS, a moveable element ME made of a header HD, a first magnet C1 and a second magnet C2. The switching device SD further comprises a printed circuit board PCB secured to the housing, a first magnetic sensing element MSE1 and a second magnetic sensing element MSE2 linked to the printed circuit board PCB.

The moveable element ME is slidably mounted in the housing and adapted to move relative to the housing between a resting position and an engaged position. To that end, the housing HS comprises a slot SL in which the moveable element is slidably guided.

The printed circuit board PCB is secured to the housing and comprises an upper face on which are mounted upfront the first magnetic sensing element MSE1 and the second magnetic sensing element MSE2.

The printed circuit board PCB further comprises a microcontroller MCU able to communicate to an interface of a host computing unit that can take action based on feedback provided by the microcontroller MCU.

It is assumed that the first magnetic sensing element MSE1 is well aligned with the first magnet C1 and that the second magnetic sensing element MSE2 is well aligned with the second magnet C2. With this architecture, the first magnetic sensing element MSE1 and the second magnetic sensing element MSE2 can be excited respectively by the first magnet C1 and the second magnet C2.

When the switching device is operated, by a human for example, the header is pressed towards direction P, i.e. towards the printed circuit board, the first magnet C1 and the second magnet C2 get closer respectively to the first magnetic sensing element MSE1 and the second magnetic sensing element MSE2 which by magnetism principles, increases the magnetic flux through the magnetic sensing elements and changes the status of the switching device if a threshold is reached. This implies that the status of the switching device relates to the magnitude of the magnetic field.

In one embodiment, the switching device is part of a button like a push button or a selector. In all cases, an action of an operator on the button (a push or a rotation of the button) will lead to a translation of the header and the magnets towards the magnetic sensing elements.

Figure 2:
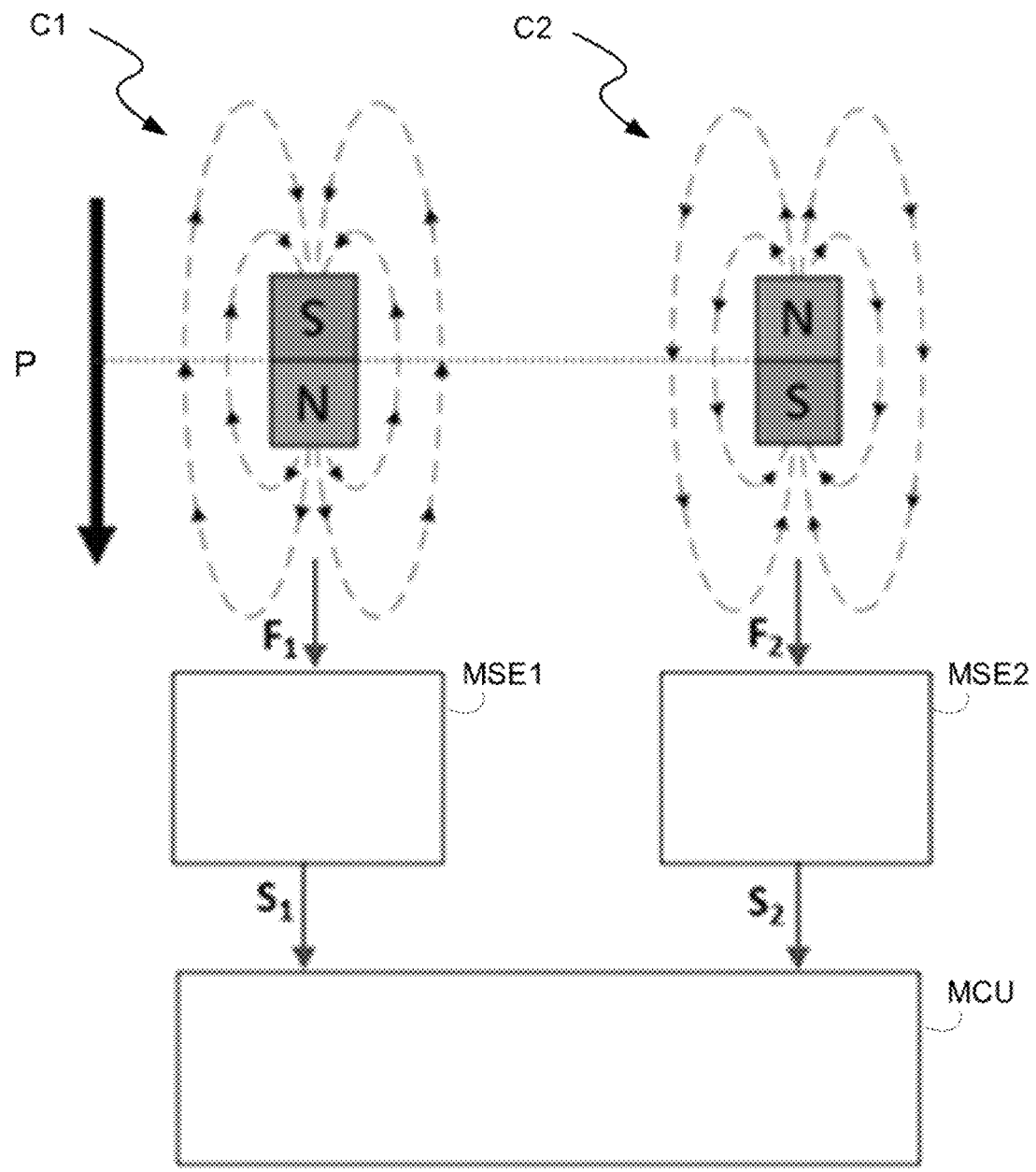
FIG. 2 illustrates a crossed input monitoring routine in the switching device according to one embodiment.

With reference to FIG. 2, there is illustrated the principle of operation of the switching device.

The first magnet C1 and the second magnet C2 produce respectively a first magnetic field $F_1$ and a second magnetic field $F_2$ that interact respectively with the first sensing element MSE1 and the second magnetic sensing element MSE2.

The first magnetic sensor and the second magnetic sensor modify their respective output signals $S_1$ and $S_2$ in agreement with a first magnetic field $F_1$ and a second magnetic field $F_2$ that have been sensed. These output signals are read by the microcontroller MCU and treated to determine the state of the switching device or whether there is a faulty condition.

The switching device implements opposite magnetic poles between the two redundant input channels of the switching device, i.e. the first magnet C1 and the second magnet C2. Regarding the direction P, the first magnet C1 presents a south magnetic pole "S" above a north magnetic pole "N", whereas the second magnet C2 presents a north magnetic pole "N" above a south magnetic pole "S". This opposite configuration allows the switching device being robust against external perturbations since external magnetic perturbation would mostly affect both magnetic sensors with the same polarity.

Moreover, due to the opposed pole configuration, there is a consistent and repeatable pattern to determine whether the state of the switching device has been changed or not, which cannot be obtained by an external perturbation.

Due to the architecture of the switching device, in one embodiment it is assumed that the first magnetic field $F_1$ generated by the first magnet C1 is reversed and equal in magnitude with respect to the second magnetic field $F_2$ generated by the second magnet C2. It can be the case especially if the first magnet C1 and the second magnet C2 have the same properties. It follows that in normal condition of operation, i.e. without magnetic perturbation, the first output signal $S_1$ and the second output signal $S_2$ should have similar properties as the first magnetic field $F_1$ and the second magnetic field $F_2$: depending on the chosen coordinate system, the first output signal $S_1$ should be reversed and equal in magnitude with respect to the second output signal $S_2$. Thus it is assumed that the sum of the first output signal and the second output signal is substantially equal to zero.

In another embodiment, the first magnetic field $F_1$ generated by the first magnet C1 is reversed but not equal in magnitude with respect to the second magnetic field $F_2$ generated by the second magnet C2. It can be the case especially if the first magnet C1 and the second magnet C2 do not have the same properties. It follows that in normal condition of operation, the first output signal $S_1$ and the second output signal $S_2$. should have similar properties as the first magnetic field $F_1$ and the second magnetic field $F_2$: depending on the chosen coordinate system, the first output signal $S_1$ should be reversed in magnitude with respect to the second output signal $S_2$. Thus it is assumed that the sum of the first output signal and the second output signal is substantially equal to a predefined value derived from the difference between the magnitude of the first magnetic field and the magnitude of the second magnetic field.

The output signal may be under different types and the behavior of the output signal with respect to the corresponding magnetic field may depend on the type of the output signal. It is considered that the output signal of a magnetic sensing element must be omni-polar, implying that the magnetic sensing element can detect and differentiate north from south poles. In non-limited examples, the output signal can be an analog output in voltage or current, or under the form of PWM and digital output.

In another embodiment, the first magnetic sensing element MSE1 and the second magnetic sensing element MSE2 may have different calibration, implying that for a similar magnetic field, the first output signal $S_1$ and the second output signal $S_2$ may be different but should have similar behavior. In that case, taking into account the calibration of the first magnetic sensing element MSE1 and the second magnetic sensing element MSE2, it can be also assumed that the sum of the first output signal and the second output signal is substantially equal to a predefined value derived from the difference between the magnitude of the first magnetic field and the magnitude of the second magnetic field.

Figure 3A:
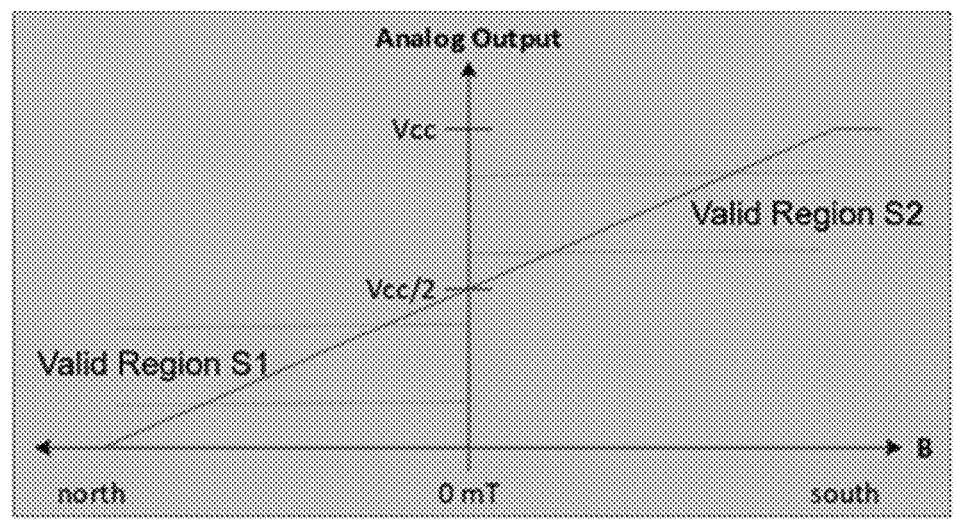
FIG. 3a illustrates the output signal under the form of an analog output in voltage as a function of the magnetic field B, with the first magnet C1 and the second magnet C2 having the same properties and the first magnetic sensing element MSE1 and the second magnetic sensing element MSE2 having similar calibration.

With reference to FIG. 3a, there is illustrated the output signal under the form of an analog output in voltage as a function of the magnetic field B, with the first magnet C1 and the second magnet C2 having the same properties and the first magnetic sensing element MSE1 and the second magnetic sensing element MSE2 having similar calibration. The same principle may apply to different types of outputs.

For example, when the header HD is not mounted on the switching device SD, which means there is no magnetic field around first magnetic sensing element MSE1 and the second magnetic sensing element MSE2, the voltage of the analogue output of first magnetic sensing element MSE1 and the second magnetic sensing element MSE2 is Vcc/2. With the pole configuration of the first magnet and second magnet of FIG. 2, when the header HD is mounted and pressed towards P, the second output signal $S_2$ increases towards Vcc and the first output signal S1 decreases towards 0.

There is defined a consistency rule according to which the output from the sensors shall be plausible whenever the following statements are always satisfied, in the present example with analog output in voltage and the offset of Vcc/2:

$$S_1+S_2 \approx Vcc$$

$$V_{min1}<S_1<V_{max1}; V_{min2}<S_2<V_{max2}$$

The minimum value $V_{min1}$ of the first output signal $S_1$ and the maximum value $V_{max1}$ of the first output signal $S_1$ define a valid region containing admissible values of the first output signal $S_1$. In a similar way, the minimum value $V_{min2}$ of the second output signal $S_2$ and the maximum value $V_{max2}$ of the second output signal $S_2$ define a valid region containing admissible values of the second output signal $S_2$.

Figure 3B:
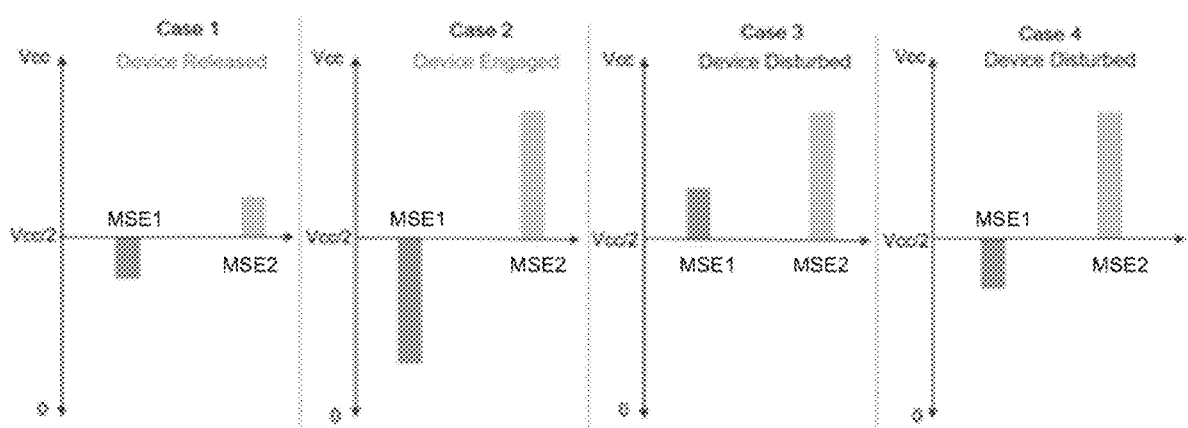
FIG. 3b illustrates the behavior of different output signals from the first sensing element MSE1 and the second magnetic sensing element MSE2.

With reference to FIG. 3b, there is illustrated the behavior of different output signals from the first sensing element MSE1 and the second magnetic sensing element MSE2.

As seen in Case 1, when the switching device is released, two reverse but equal in magnitude magnetic fields are sensed by the first sensing element MSE1 and the second magnetic sensing element MSE2. As seen in Case 2, when the switching device is engaged, both magnetic fields increase as the first magnet and the second magnet get much closer respectively to the first sensing element MSE1 and the second magnetic sensing element MSE2. For both Case 1 and Case 2, the consistency of both magnetic fields remains which allows to easily determine that the outputs are reliable to be taken into account.

Case 3 and Case 4 do not satisfy the two conditions of the consistency rule. Therefor Case 3 and Case 4 are considered as disturbances of deviations. This simple approach of using inverse magnetic fields to manage the redundancy in switching devices offers an easy way and cost-effective fashion detect and manage external disturbances. Moreover, the principle can be used to diagnose the integrity of the overall device with very simple principles, which allows to significantly increase the diagnostic coverage.

Figure 4:
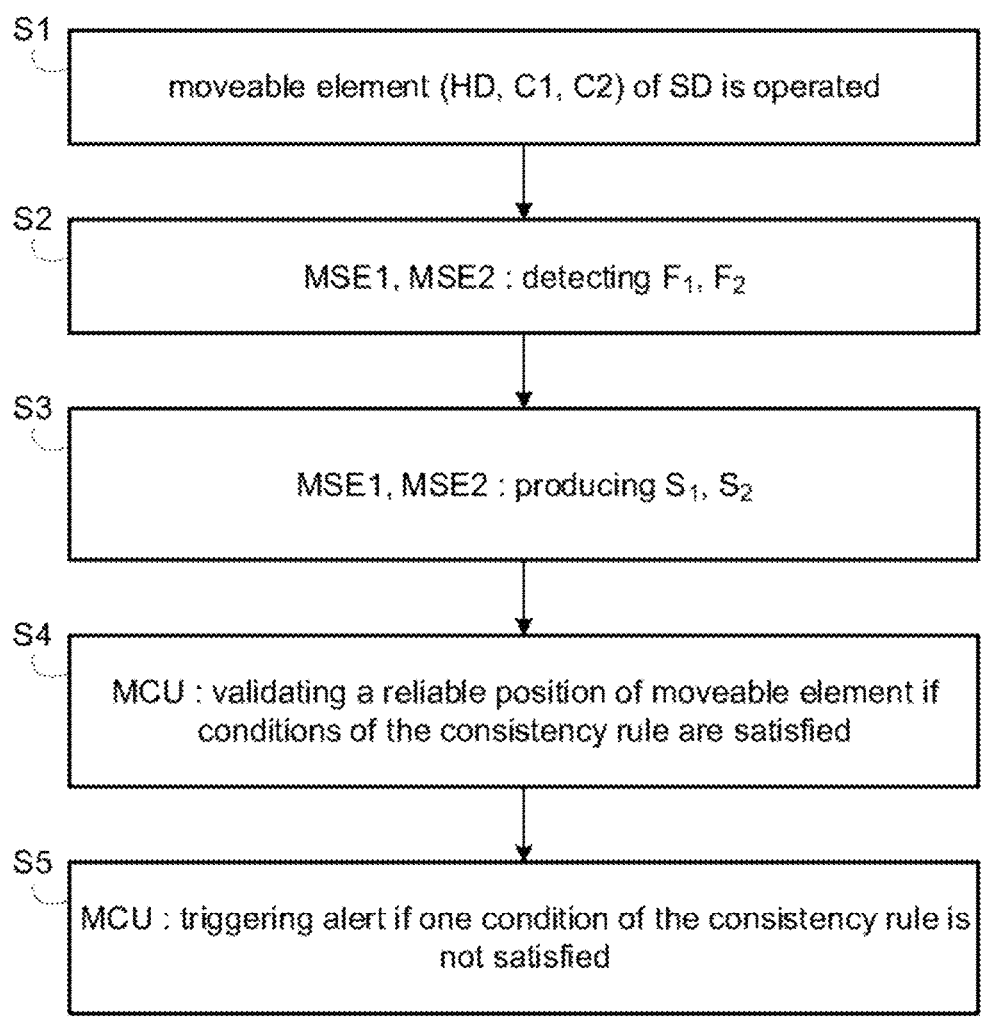
FIG. 4 is a flow diagram of a method for a crossed input monitoring of magnetic sensing elements of a switching device according to one embodiment.

With reference to FIG. 4, a method for validating a reliable position of a moveable element of a switching device SD according to one embodiment of the invention comprises steps S1 to S5.

In step S1, the moveable element, made of the header HD, the first magnet C1 and the second magnet C2 is operated, engaged or released, and the moveable element is moving relative to the housing between a released position and an engaged position.

In step S2, the first magnetic sensing element MSE1 and the second magnetic sensing element MSE2 detect respectively a first magnetic field $F_1$ and a second magnetic field $F_2$ generated respectively by the first magnet C1 and the second magnet C2.

In step S3, the first magnetic sensing element MSE1 and the second magnetic sensing element MSE2 produce respectively a first output signal $S_1$ and a second output signal $S_2$ from the first magnetic field F1 and the second magnetic field F2.

In step S4, the microcontroller MCU validates a reliable position of the moveable element if the two following conditions of the consistency rule are satisfied:
the first output signal is included in a first range of values and if the second output signal is included in a second range of values, and
the sum of the first output signal and the second output signal is substantially equal to a predefined value derived from the difference between the magnitude of the first magnetic field and the magnitude of the second magnetic field.

The microcontroller does not validate a reliable position of the moveable element and detects a magnetic perturbation if at least one of the two conditions is not satisfied, in other words:
if the first output signal is not included in a first range of values or if the second output signal is not included in a second range of values, and/or
if the sum of the first output signal and the second output signal is not substantially equal to a predefined value derived from the difference between the magnitude of the first magnetic field and the magnitude of the second magnetic field.

In a general manner, the first magnetic field $F_1$ generated by the first magnet C1 is reversed and approximately equal in magnitude with respect to the second magnetic field $F_2$ generated by the second magnet C2. As the first output signal and the second output signal have similar behavior as the first magnetic field and the second magnetic field, the sum of the first output signal and the second output signal is approximately equal to a predefined value, the predefined value being derived from the difference between the magnitude of the first magnetic field and the magnitude of the second magnetic field.

In step S5, when the microcontroller MCU detects a magnetic perturbation, the microcontroller MCU can trigger an alert or an error that is then handled by a control system of the switching device, a decision being taken by the control system with respect to the type and the context of the switching device. For example, in a critical context requiring high reliability of the state of the switching device, if a perturbation is detected, the control system can consider it as an error.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:
1. A switching device comprising:
a housing,
a moveable element made of a header, a first magnet and a second magnet and slidably mounted in the housing, the moveable element being adapted to move relative to the housing between a released position and an engaged position,
a printed circuit board comprising a microcontroller and an upper face on which are mounted upfront a first magnetic sensing element and a second magnetic sensing element positioned to face the first magnet and the second magnet,
wherein the first magnetic sensing element and the second magnetic sensing element are configured to detect respectively a first magnetic field and a second magnetic field generated respectively by the first magnet and the second magnet, wherein the moveable element is closer to the first magnetic sensing element and the second magnetic sensing element in the engaged position than in the released position,
wherein a pole configuration of the first magnet is opposed to a pole configuration of the second magnet and the first magnetic field generated by the first magnet is reversed in magnitude with respect to the second magnetic field generated by the second magnet,
wherein the first magnetic sensing element and the second magnetic sensing element are able to produce respectively a first output signal and a second output signal from the first magnetic field and the second magnetic field,
wherein the microcontroller is able to validate that the first and second output signals are reliable for determining a position of the moveable element:
when the first output signal is included in a first range of values and when the second output signal is included in a second range of values, and
when a sum of the first output signal and the second output signal is substantially equal to a predefined value derived from a difference between the magnitude of the first magnetic field and the magnitude of the second magnetic field.
2. The switching device according to claim 1, wherein the microcontroller is able to detect a magnetic perturbation:
when the first output signal is not included in the first range of values or when the second output signal is not included in the second range of values, and/or
when the sum of the first output signal and the second output signal is not substantially equal to the predefined value.

3. The switching device according to claim 2, wherein the microcontroller is able to trigger an alert when the magnetic perturbation is detected.

4. The switching device according to claim 1, wherein the predefined value is zero when the first magnet and the second magnet have the same properties.

5. The switching device according to claim 1, wherein when the switching device is operated, the header is pressed towards the printed circuit board, the first magnet and the second magnet get closer respectively to the first magnetic sensing element and the second magnetic sensing element, which increases a magnetic flux through the magnetic sensing elements and changes a status of the switching device when a threshold is reached.

6. The switching device according to claim 1, wherein the first magnetic sensing element and the second magnetic sensing element are omni-polar sensors being able to differentiate a north magnetic pole from a south magnetic pole.

7. The switching device according to claim 1, wherein the first magnetic sensing element is aligned with the first magnet and a first inductor and the second magnetic sensing element is aligned with the second magnet and a second inductor.

8. The switching device according to claim 1, being part of a push button or a selector.

9. A method for validating that output signals produced by magnetic sensing elements of a switching device are reliable for determining a position of a moveable element of the switching device, the switching device comprising a housing, the moveable element being made of a header, a first magnet and a second magnet and slidably mounted in the housing, the moveable element being adapted to move relative to the housing between a released position and an engaged position, the switching device further comprising a printed circuit board comprising a microcontroller and an upper face on which are mounted upfront a first magnetic sensing element and a second magnetic sensing element positioned to face the first magnet and the second magnet, the method comprising:

the first magnetic sensing element and the second magnetic sensing element detecting respectively a first magnetic field and a second magnetic field generated respectively by the first magnet and the second magnet, wherein the moveable element is closer to the first magnetic sensing element and the second magnetic sensing element in the engaged position than in the released position, wherein a pole configuration of the first magnet is opposed to a pole configuration of the second magnet and the first magnetic field generated by the first magnet is reversed and equal in magnitude with respect to the second magnetic field generated by the second magnet, the first magnetic sensing element and the second magnetic sensing element producing respectively a first output signal and a second output signal from the first magnetic field and the second magnetic field, the microcontroller validating that the first and second output signals are reliable for determining a position of the moveable element:

when the first output signal is included in a first range of values and when the second output signal is included in a second range of values, and when the sum of the first output signal and the second output signal is substantially equal to a predefined value derived from a difference between the magnitude of the first magnetic field and the magnitude of the second magnetic field.

10. A non-transitory computer-readable medium having embodied thereon a computer program for executing the method according to claim 9.

* * * * *